(12) United States Patent
Pavao-Moreira et al.

(10) Patent No.: US 9,742,393 B2
(45) Date of Patent: Aug. 22, 2017

(54) VOLTAGE SUPPLY CIRCUIT WITH AN AUXILIARY VOLTAGE SUPPLY UNIT AND METHOD FOR STARTING UP ELECTRONIC CIRCUITRY

(71) Applicants: Cristian Pavao-Moreira, Frouzins (FR); Birama Goumballa, Larra (FR); Olivier Tico, Saint Lys (FR)

(72) Inventors: Cristian Pavao-Moreira, Frouzins (FR); Birama Goumballa, Larra (FR); Olivier Tico, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/028,597

(22) PCT Filed: Oct. 18, 2013

(86) PCT No.: PCT/IB2013/002715
§ 371 (c)(1),
(2) Date: Apr. 11, 2016

(87) PCT Pub. No.: WO2015/056041
PCT Pub. Date: Apr. 23, 2015

(65) Prior Publication Data
US 2016/0241228 A1 Aug. 18, 2016

(51) Int. Cl.
*H03L 7/00* (2006.01)
*H03K 17/22* (2006.01)
(Continued)

(52) U.S. Cl.
CPC .......... *H03K 17/223* (2013.01); *G05F 1/569* (2013.01); *G05F 1/575* (2013.01); *H03K 3/0377* (2013.01)

(58) Field of Classification Search
CPC ............... H03K 17/223; H03K 3/0377; G05F 1/569575
(Continued)

(56) References Cited

U.S. PATENT DOCUMENTS 5,319,601 A * 6/1994 Kawata .................. G11C 5/147
327/143
6,917,554 B2 * 7/2005 Annavajjhala ......... G11C 16/30
257/E27.103
(Continued)

FOREIGN PATENT DOCUMENTS

CN 101568893 A 10/2009
CN 102915070 A 2/2013
(Continued)

OTHER PUBLICATIONS

International Search Report for Application No. PCT/I B2013/002715, dated Jul. 21, 2014, 8 pages.

*Primary Examiner* — Ryan Jager

(57) ABSTRACT

A voltage supply circuit for an electronic circuit includes a switch configured to selectively connect a supply input of the electronic circuit with a main supply voltage source. An auxiliary voltage supply unit has an auxiliary voltage output coupled to the supply input of the electronic circuit. The auxiliary voltage supply unit is configured to at least temporarily output an auxiliary voltage to the supply input. The auxiliary voltage has a voltage level lower than a voltage level of a main supply voltage supplied by the main supply voltage source.

10 Claims, 1 Drawing Sheet

(51) Int. Cl.
*G05F 1/569* (2006.01)
*G05F 1/575* (2006.01)
*H03K 3/037* (2006.01)

(58) Field of Classification Search
USPC ........................................................ 327/143
See application file for complete search history.

(56) References Cited

U.S. PATENT DOCUMENTS

| | | | |
|---|---|---|---|
| 6,940,336 B2 | 9/2005 | Bakker | |
| 7,663,353 B2 | 2/2010 | Draxelmayr | |
| 7,911,195 B2 | 3/2011 | Draxelmayr | |
| 9,292,024 B2* | 3/2016 | Fujita | G05F 1/46 |
| 2008/0180157 A1* | 7/2008 | Choi | G06F 1/26 |
| | | | 327/384 |
| 2009/0039951 A1 | 2/2009 | Sako | |
| 2010/0201411 A1* | 8/2010 | Kim | G11C 5/144 |
| | | | 327/143 |
| 2012/0176188 A1 | 7/2012 | Bansal et al. | |
| 2013/0027820 A1 | 1/2013 | Padilla et al. | |
| 2013/0033251 A1 | 2/2013 | Nagatomo | |
| 2013/0038362 A1* | 2/2013 | Seshita | H03K 17/693 |
| | | | 327/143 |
| 2013/0106394 A1* | 5/2013 | Kobayashi | G05F 3/242 |
| | | | 323/314 |
| 2014/0097702 A1* | 4/2014 | Upputuri | G11C 5/063 |
| | | | 307/115 |
| 2015/0241889 A1* | 8/2015 | Chen | G05F 1/67 |
| | | | 327/143 |
| 2015/0378385 A1* | 12/2015 | Rana | G05F 3/16 |
| | | | 327/143 |

FOREIGN PATENT DOCUMENTS

| | | | | |
|---|---|---|---|---|
| DE | 102004004305 A1 | 8/2005 | | |
| IL | WO 2013179087 A1 * | 12/2013 | ....... | H03K 17/04123 |
| KR | 20090015864 A | 2/2009 | | |
| WO | 2012079570 A2 | 6/2012 | | |

* cited by examiner

VOLTAGE SUPPLY CIRCUIT WITH AN AUXILIARY VOLTAGE SUPPLY UNIT AND METHOD FOR STARTING UP ELECTRONIC CIRCUITRY

FIELD OF THE INVENTION

This invention relates to a voltage supply circuit for an electronic circuit. The invention also relates to a method for starting up electronic circuitry. The invention further relates to an integrated circuit comprising an electronic circuit and a voltage supply circuit

BACKGROUND OF THE INVENTION

Electronic circuits that are supplied during normal operation with supply voltages that are higher than usually acceptable voltages for its internal components, such as complementary metal oxide semiconductor (CMOS) or bipolar switching devices, may experience transient operational conditions during which the acceptable voltages at its internal components are temporarily exceeded. This causes stress to the internal components since the safety operation area (SOA) of the electronic circuit is at least temporarily left. Repeated and prolonged remainder outside the SOA of an electronic circuit may have a negative impact on the reliability, lifetime and accuracy of the circuit.

U.S. Pat. No. 6,917,554 discloses a protection circuit for internal nodes of a flash EEPROM chip from a power pad. The protection circuit is able to maintain the node voltage at the internal nodes at a predetermined voltage level by means of diode connected devices and a current bleeding path.

U.S. Pat. No. 6,940,336 discloses a voltage regulator with switch-on protection circuitry that initially blocks an output transistor of the regulator while an input voltage rises during start-up and that enables the output transistor of the regulator after lapse of a start-up guard period.

U.S. Pat. No. 5,319,601 discloses a power supply circuit for a DRAM with a power-on detection circuit which detects when an external power supply potential reaches a predetermined potential. An internal power supply circuit further has two intermediate potential generating circuits of which the one with the larger driving capability is only initially activated during a ramp-up period of the external power supply potential.

However, a disadvantage of the above circuits is that they do not sufficiently protect electronic circuitry that is supplied with an external supply voltage from overvoltage.

SUMMARY OF THE INVENTION

The present invention provides a voltage supply circuit for an electronic circuit, a method for starting up electronic circuitry, and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the FIGS. are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Figure 1:
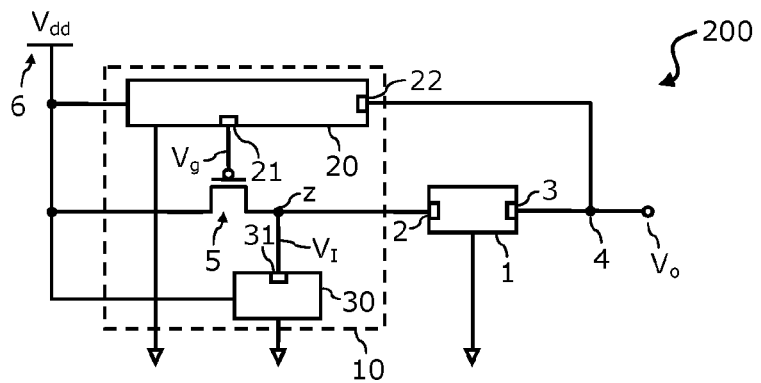
FIG. 1 schematically illustrates an exemplary embodiment of an integrated circuit with an electronic circuit and a voltage supply circuit.

FIG. 1 illustrates an example of an integrated circuit 200. The integrated circuit 200 comprises an electronic circuit 1, for example a bandgap reference circuit, a voltage regulator, a digital-to-analog converter or any similar device. The electronic circuit 1 may for example be operated during normal use with a supply voltage that is higher than a maximum acceptable voltage. e.g. higher than acceptable for CMOS or bipolar components.

It has been found that, in particular during start-up of such an electronic circuit 1, transient SOA phenomena may occur, if the supply voltage is applied while the electronic circuit 1, or blocks thereof, are still settling on a stable operational state. The settling of the electronic circuit 1 or blocks thereof usually takes place within a dozen nanoseconds to some microseconds. Especially during this period the electronic circuit 1 and its internal components are prone to temporary overvoltage stress. A typical main supply voltage Vdd for the electronic circuit 1 is for example 5 V which is delivered via a switch that is configured to selectively connect a supply input of the electronic circuit 1 to a main supply voltage source. The switch may for example be a PMOS device with a high width to length ratio, i.e. a low on-state resistance.

It has further been found that a way in which SOA violations may be effectively prevented, or at least the probability thereof be reduced, is to temporarily create an intermediate supply voltage lower than the normal external supply voltage and supply it to an electronic circuit during a start-up period of the electronic circuit. During that period the external supply voltage is temporarily blocked. Once the electronic circuit has started-up, the intermediate supply voltage is switched off and the external supply voltage is applied to the electronic circuit. In this manner, a stepped start-up voltage profile may be created that prevents or at least reduces the probability of SOA violations, i.e. overvoltage conditions at internal components of the electronic circuit.

Still referring to the example of FIG. 1, a voltage supply circuit 10 is shown therein which implement this way. In this example, the integrated circuit 200 therefore includes the voltage supply circuit and enables to prevent, or at least reduce, overstress of the electronic circuit 1 and its internal components. In the shown example, the voltage supply circuit 10 is provided in the same integrated circuit, e.g. on the same die or on a separate die in the same package, as the electronic circuit, but it will be apparent that the voltage supply circuit 10 may also be implemented as a separate circuit. The voltage supply circuit 10 includes a switch 5 and an auxiliary voltage supply unit 30. The auxiliary voltage supply unit 30 comprises an auxiliary voltage output 31 which is coupled to a supply input 2 of the electronic circuit 1 via a node z between the switch 5 and the supply input 2. The auxiliary voltage supply unit 30 is configured to at least temporarily output an auxiliary voltage $V_l$ to the supply input 2, preferably during a start-up period of the electronic circuit 1. The auxiliary voltage $V_l$ has a voltage level lower than a voltage level of the main supply voltage Vdd supplied by the main supply voltage source 6. The auxiliary voltage supply unit 30 may be configured to output the auxiliary voltage $V_l$ at an auxiliary voltage output 31 to the node z. The auxiliary voltage output 31 may preferably have low output impedance, for example less than 10Ω.

The difference between the auxiliary voltage and the main supply voltage may have any suitable value. For example, an auxiliary voltage $V_l$ found to be suitable is about 3.2 V, if the main supply voltage Vdd has a voltage level of 5 V but other values may be used depending on what is suitable for the specific implementation to reduce the risk SOA violations to the level desired.

When the auxiliary voltage $V_l$ is supplied to the supply input 2 of the electronic circuit 1, e.g. during the start-up period, the switch 5 may remain open and hence the main supply voltage source be disconnected from the supply input 2 of the electronic circuit. This may be achieved by a sensing unit 20 of the voltage supply circuit 10, as is shown in the example of FIG. 1, which is connected with an activation terminal 21 to a control input of the switch (e.g. to the gate in case the switch is implemented as a FET) and can control the state of the switch, i.e open or closed, therethrough. The sensing unit 20 may be coupled with a sensing input to an output 3 of the electronic circuit 1 via a node 4 and a detection terminal 22. The sensing unit 20 may be configured to sense an output voltage or internal voltage $V_o$ of the electronic circuit 1. If after start-up the sensed voltage level is below a predetermined threshold, the switch 5 may be controled via the activation terminal to be inactive, i.e. open, and the supply input 2 to be disconnected from the main supply voltage. If, some point of time after start-up, the sensed voltage level of the output voltage or internal voltage $V_o$ comes above the predetermined threshold, the switch 5 may be activated via the activation terminal 21 of the sensing unit 20 with an appropriate activation gate signal and the main supply voltage source be connected to the supply input 2. Depending on the specific implementation, the switch 5 may then be controlled such that once the switch 5 is closed, it may remain closed until the electronic circuit is powered down.

Thus, after a start-up period of the electronic circuit 1, i.e. when the output voltage or internal voltage $V_o$ has settled, the switch 5 may be closed in order to supply the electronic circuit 1 with the main supply voltage Vdd for normal operation. After the start-up period has finished, the sensing unit 20 may be deactivated in order to save current.

FIG. The auxiliary voltage supply unit 30 may be implemented in any manner suitable for the specific implementation. Referring to the more detailed view of an example of an integrated circuit 200 with an electronic circuit 1 and a voltage supply circuit 10. of FIG. 2, for instance, the auxiliary voltage supply unit may comprise a current mirror circuit 32 with a voltage source path and a current-following path. As exemplarily shown, the current mirror circuit 32 may e.g. be implemented as a current-sinking type. The voltage source path may include a series connection of a biasing resistor 36, a transistor 33 diode-connected at the node x and a voltage reference 35. The voltage reference 35 may for example be a Zener diode, a bandgap reference or a diode and be capable of providing a predeterminable reference voltage. The current-following path may comprise a mirror transistor 34 gate-coupled to the node x and the gate of the transistor 33 and a load resistor 37. In use, the load resistor 37 is stressed by the auxiliary voltage $V_l$ which depends on the output voltage of the voltage reference 35.

The currents through the voltage source path and the current-following path are "always-on" currents, their sum preferably not exceeding a predetermined maximum value, for example 2 µA. The voltage drop over the load resistor 37 defines the voltage at the node y which is the auxiliary voltage being supplied to the supply input 2 of the electronic circuit 1 via node z. With transistors 33 and 34—for example FET transistors—having similar or identical width to length ratio, the voltage at the node y will equal to the voltage provided by the voltage reference 35. The resistance values of the resistors 36 and 37 as well as the voltage reference 35 may be chosen such that the auxiliary supply voltage $V_l$ is set to a desired intermediate level lower than the main supply voltage Vdd and that the overall current through the resistors does not exceed a maximum level, for example 2 µA. In that sense, the transistor 33 may be used to compensate for process variations of transistor 34 in order to obtain a constant auxiliary supply voltage $V_l$.

Figure 2:
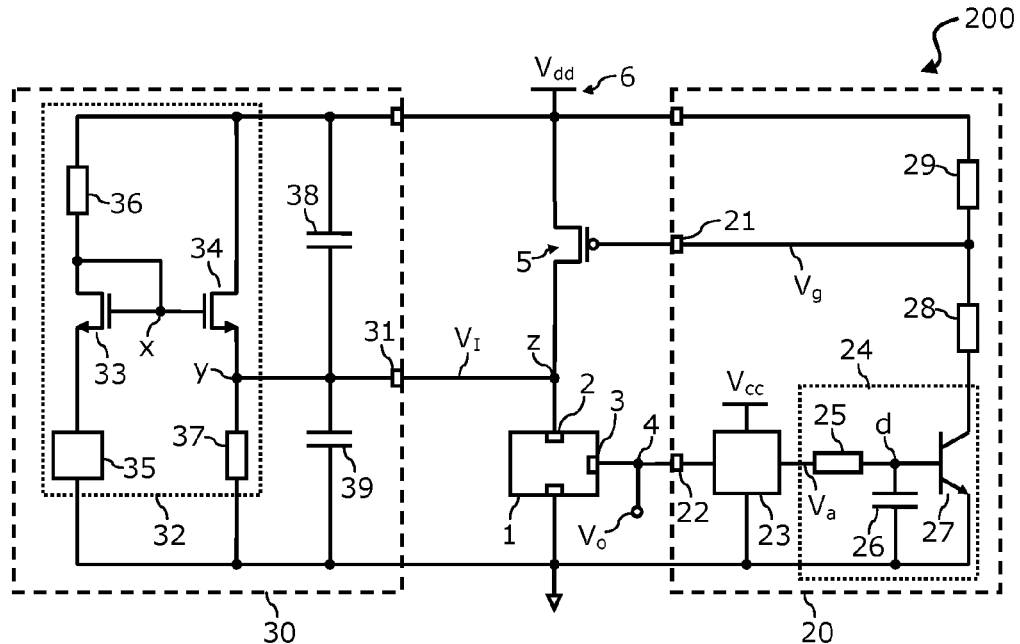
FIG. 2 schematically illustrates a more detailed view of FIG. 1 according to yet another exemplary embodiment of an integrated circuit with an electronic circuit and a voltage supply circuit.

As further shown in FIG. 2, the auxiliary voltage supply unit 30 may further comprise buffering capacitors 38 and 39 coupled between the main supply voltage source 6 and the node y as well as between the node y and ground, respectively. The capacitance values of the buffering capacitors 38 and 39 may be chosen such that transient spikes of the auxiliary supply voltage $V_l$ may be avoided, for example several hundreds of fF.

The sensing unit 20 may be implemented in any manner suitable for the specific implementation. As shown in FIG. 2, for example, the sensing unit may comprise a level detection circuit 23 which is coupled to the output 3 of the electronic circuit 1 via node 4 and the detection terminal 22. The level detection circuit 23 may be configured to output an activation signal $V_a$ for activating the switch 5, if the voltage level of the output voltage or internal voltage $V_o$ exceeds the predetermined threshold.

The level detection circuit 23 may be implemented in any manner suitable for the specific implementation. As shown in FIG. 2, the level detection circuit 23 may for example comprise a Schmitt trigger or degenerated inverters. The level detection circuit 23 may be powered by an appropriate supply voltage Vcc, for example 1.8 V or 3.3 V. The level detection circuit 23 may be coupled to a ramping circuit 24 that may be configured to ramp the activation signal $V_a$ from low level to high level for soft-switching the switch 5, i.e. for gradually closing the switch 5 in order to allow for the supply voltage at the supply input 2 to rise smoothly from the auxiliary supply voltage level to the main supply voltage level. The ramping circuit 24 may be implemented in any manner suitable for the specific implementation. As shown in FIG. 2, for example, the ramping circuit 24 may, comprise a RC circuit comprising a resistor 25 and a capacitor 26 which are coupled via a node d to a gate of an activation switch 27, for example an NPN bipolar junction transistor.

When the voltage level of the output voltage or internal voltage $V_o$ is still detected to be below the predetermined threshold, the switch 5 is closed since the activation signal $V_a$ is low and the activation switch 27 is closed. When the voltage level of the output voltage or internal voltage $V_o$ rises above the predetermined threshold, the activation signal $V_a$ is set high and the gate voltage of the activation switch 27 rises with a progressive ramp given by the RC constant of the RC circuit. The current through the voltage divided resistors 28 and 29 starts to flow from the main supply voltage source 6 to ground and the gate voltage $V_g$ of the switch 5 gradually decreases, thereby causing the switch 5 to gradually close. This causes the voltage level of the supply voltage at the supply input 2 of the electronic circuit 1 to progressively ramp up from the auxiliary supply voltage level to the main supply voltage level Vdd. The length of the start-up period, i.e. the period from activating the electronic circuit 1 to fully supplying the electronic circuit 1 with the main supply voltage Vdd may for example be on the order of a few μs.

Figure 3:
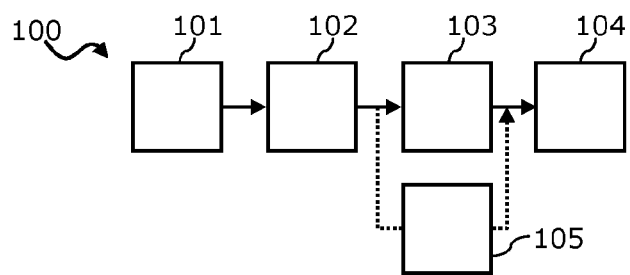
FIG. 3 schematically shows an exemplary method of starting electronic circuitry according to another embodiment.

FIG. 3 schematically shows an exemplary method 100 of starting electronic circuitry. The method 100 may for example be employed in the integrated circuit 200 of FIGS. 1 and 2 and may be used to start-up the electronic circuit 1 of FIG. 1 or 2. It will be apparent that although FIG. 3 shows discrete blocks for the sake of comprehensibility, some of the operations illustrated with the block may be performed operlapping, at least partially, in time where suitable or possible.

The method 100 comprises at 101 supplying a main supply voltage Vdd to an auxiliary voltage supply unit, for example the auxiliary voltage supply unit 30 of FIGS. 1 and 2. At 102, the main supply voltage Vdd is converted to an auxiliary supply voltage $V_I$, wherein the auxiliary voltage $V_I$ has a voltage level lower than a voltage level of the main supply voltage Vdd. The auxiliary voltage $V_I$ is temporarily outputted to a supply input 2 of the electronic circuit 1, e.g. during a start-up period of the electronic circuit 1 at 103. As shown at 105, an output voltage or internal voltage $V_I$ of the electronic circuit 1 may be monitored, which triggers the enabling or disabling of outputting the auxiliary voltage. After the start-up period, for example dependent on the monitored output voltage or internal voltage $V_o$ at 105, the main supply voltage Vdd may be supplied to the electronic circuit 1 at 104 instead of the auxiliary supply voltage.

With the method 100, a bandgap reference circuit, a voltage regulator, a digital-to analog converter or any similar device may be protected from overstress by operating it initially under a safe voltage level which is lower than the usual main supply voltage level. Once the device to be protected has fully started up and settled its internal voltages, the main supply voltage is supplied to the device. This technique may be scalable to any electronic circuit 1 which provides for a voltage indicating that the electronic circuit 1 is started up and has essentially settled. It can be applied irrespective of process technology of the electronic circuit 1 since the voltage level of the auxiliary or intermediate supply voltage can be freely adapted. The design time of the electronic circuit 1 may advantageously be reduced. SOA violations may be avoided, hence leading to a higher product/circuit lifetime and increased reliability.

In the foregoing specification, the invention has been described with reference to specific examples of embodiments of the invention. It will, however, be evident that various modifications and changes may be made therein without departing from the broader scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Conversely, if the logically true state is a logic level zero, the logically false state is a logic level one.

Although the invention has been described with respect to specific conductivity types or polarity of potentials, skilled artisans appreciated that conductivity types and polarities of potentials may be reversed.

Some of the above embodiments, as applicable, may be implemented using a variety of different FET or MOS devices and circuitry components. For example, the exemplary topology in the FIGS. and the discussion thereof is presented merely to provide a useful reference in discussing various aspects of the invention. Of course, the description of the topology has been simplified for purposes of discussion, and it is just one of many different types of appropriate topologies that may be used in accordance with the invention.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, the electronic circuit may be physically distributed over a number of components apparatuses, while functionally operating as a single device, such as on one or more semiconductor dice on which components are provided that are connected such that the electronic circuit is formed. Such die or dice may for instance integrated in a single integrated circuit package. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an."

The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage supply circuit for an electronic circuit, comprising:
   a switch connectable to a supply input of the electronic circuit and a main supply voltage source providing a main supply voltage, the switch being arranged to selectively connect the supply input of the electronic circuit to the main supply voltage source;
   an auxiliary voltage supply unit having an auxiliary voltage output arranged to be coupled to the supply input of the electronic circuit, the auxiliary voltage supply unit being configured to at least temporarily output at the auxiliary voltage output an auxiliary voltage to the supply input instead of the main supply voltage, the auxiliary voltage having a voltage level lower than a voltage level of the main supply voltage, wherein the auxiliary voltage supply unit comprises a current mirror circuit comprising a voltage source path with a diode-connected transistor and with a voltage reference circuit, and a current-following path with a mirror transistor and with a load resistor, the load resistor being stressed by the auxiliary voltage which depends on the output of the voltage reference circuit;
   a sensing unit coupled to an output of the electronic circuit, the sensing unit being configured to sense an output voltage or internal voltage of the electronic circuit and to activate the switch, if the voltage level of the output voltage or internal voltage exceeds a predetermined threshold.

2. The voltage supply circuit of claim 1, wherein the auxiliary voltage supply unit is configured to output the auxiliary voltage to the supply input during a start-up period of the electronic circuit.

3. The voltage supply circuit of claim 1, wherein the sensing unit comprises:
   a level detection circuit coupled to the output of the electronic circuit, the level detection circuit being configured to output an activation signal for activating the switch, if the voltage level of the output voltage or internal voltage exceeds the predetermined threshold.

4. The voltage supply circuit of claim 3, wherein the level detection circuit comprises one of a Schmitt trigger or degenerated inverters.

5. The voltage supply circuit of claim 1, the sensing circuit further comprising:
   a ramping circuit coupled to the level detection circuit, the ramping circuit being configured to ramp the activation signal from low level to high level for smoothly changing the gate voltage of the switch from high to low level.

6. The voltage supply circuit of claim 1, wherein the voltage reference circuit comprises one of a Zener diode, a bandgap reference and a diode.

7. The voltage supply circuit of claim 1, wherein the switch comprises a PMOS transistor having a high width-to-length ratio.

8. A method for starting up an electronic circuit, the method comprising:
   supplying a main supply voltage to a supply input of the electronic circuit;
   supplying an auxiliary voltage with an auxiliary voltage supply unit having an auxiliary voltage output arranged to be coupled to the supply input of the electronic circuit, wherein
      the auxiliary voltage supply unit comprises a current mirror circuit comprising a voltage source path with a diode-connected transistor and with a voltage reference circuit, and a current-following path with a mirror transistor and with a load resistor, the load resistor being stressed by the auxiliary voltage which depends on the output of the voltage reference circuit;
   temporarily outputting the auxiliary voltage instead of the main supply voltage to a supply input of the electronic circuit during a start-up period of the electronic circuit, the auxiliary voltage having a voltage level lower than a voltage level of the main supply voltage;
   supplying the main supply voltage to the electronic circuit after the start-up period;
   monitoring an output voltage or internal voltage of the electronic circuit, wherein the end of the start-up period is dependent on the monitored output voltage or internal voltage.

9. An integrated circuit, comprising:
   an electronic circuit;
   a switch connectable to a supply input of the electronic circuit and a main supply voltage source providing a main supply voltage, the switch being arranged to selectively connect the supply input of the electronic circuit to the main supply voltage source; and
   an auxiliary voltage supply unit having an auxiliary voltage output arranged to be coupled to the supply input of the electronic circuit, the auxiliary voltage supply unit being configured to at least temporarily output at the auxiliary voltage output an auxiliary voltage to the supply input instead of the main supply voltage, the auxiliary voltage having a voltage level lower than a voltage level of the main supply voltage, wherein the auxiliary voltage supply unit comprises a current mirror circuit comprising a voltage source path with a diode-connected transistor and with a voltage reference circuit, and a current-following path with a mirror transistor and with a load resistor, the load resistor being stressed by the auxiliary voltage which depends on the output of the voltage reference circuit;
   a sensing unit coupled to an output of the electronic circuit, the sensing unit being configured to sense an output voltage or internal voltage of the electronic circuit and to activate the switch, if the voltage level of the output voltage or internal voltage exceeds a predetermined threshold.

10. The integrated circuit of claim 9, wherein the electronic circuit comprises one of a bandgap reference circuit, a voltage regulator, and/or a digital-to-analog converter.

* * * * *